United States Patent
Nakazawa et al.

(10) Patent No.: US 6,867,462 B2
(45) Date of Patent: Mar. 15, 2005

(54) SEMICONDUCTOR DEVICE USING AN SOI SUBSTRATE AND HAVING A TRENCH ISOLATION AND METHOD FOR FABRICATING THE SAME

(75) Inventors: Satoshi Nakazawa, Osaka (JP); Satoru Ouchi, Osaka (JP); Yasuhiro Uemoto, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 13 days.

(21) Appl. No.: 10/636,653

(22) Filed: Aug. 8, 2003

(65) Prior Publication Data

US 2004/0026746 A1 Feb. 12, 2004

(30) Foreign Application Priority Data

Aug. 9, 2002  (JP) ........................................ 2002-232416

(51) Int. Cl.$^7$ ........................ H01L 27/095; H01L 29/861
(52) U.S. Cl. ........................ 257/374; 257/381; 257/385; 257/397; 257/353
(58) Field of Search .................................. 257/374, 381, 257/385, 397, 353

(56) References Cited

U.S. PATENT DOCUMENTS 4,593,459 A  * 6/1986 Poppert et al. ............. 438/222
5,688,702 A  * 11/1997 Nakagawa et al. ......... 438/234

FOREIGN PATENT DOCUMENTS

| JP | 08-213407 | 8/1996 |
|---|---|---|
| JP | 09-120995 | 5/1997 |
| JP | 10-93045 | 4/1998 |
| JP | 10-270663 | 10/1998 |
| JP | 11-214656 | 8/1999 |
| JP | P2000-114488 A | 4/2000 |
| JP | P2000-294744 A | 10/2000 |
| JP | P2001-144307 A | 5/2001 |
| JP | P2002-28323 A | 1/2002 |
| JP | P2002-33484 A | 1/2002 |
| JP | P2002-64210 A | 2/2002 |
| JP | P2002-76113 A | 3/2002 |
| JP | P2002-299475 A | 10/2002 |
| JP | P2003-7850 A | 1/2003 |

* cited by examiner

*Primary Examiner*—Minhloan Tran
*Assistant Examiner*—Tan Tran
(74) *Attorney, Agent, or Firm*—McDermott Will & Emery LLP

(57) ABSTRACT

A trench isolation region separating active regions in which MISFETs are formed includes: side insulating films covering the sides of a trench; polycrystalline semiconductor layers of a first conductivity type covering the respective sides of the side insulating films; and a polycrystalline semiconductor layer of a second conductivity type filling a gap between the polycrystalline semiconductor layers of the first conductivity type. Two pn junctions extending along the depth direction of the trench are formed between each of the polycrystalline semiconductor layers of the first conductivity type and the polycrystalline semiconductor layer of the second conductivity type. Upon application of a voltage between the active regions, a depletion layer expands in one of the pn junctions, so that the voltage is also partly applied to the depletion layer. As a result, the concentration of electric field in the side insulating films is relaxed.

9 Claims, 7 Drawing Sheets

SEMICONDUCTOR DEVICE USING AN SOI SUBSTRATE AND HAVING A TRENCH ISOLATION AND METHOD FOR FABRICATING THE SAME

BACKGROUND OF THE INVENTION

With the recent reduction in size of semiconductor elements such as transistors, trench isolation has been adopted as a technique for isolating transistors in semiconductor integrated circuits. Specifically, this trench isolation is a technique for isolating adjacent active regions by forming a trench (groove) in a surface region of a semiconductor substrate to define the active regions and then filling the trench with an insulator film.

In particular, in a semiconductor device using a silicon on insulator (SOI) substrate with a structure in which a semiconductor layer for forming active regions therein is provided on an insulating layer, if a trench is formed to reach the insulating layer, isolation can be made as intended. For example, in Japanese Laid-Open Publication No. 61-059852, a trench is formed in a semiconductor layer to reach an insulating layer, using an SOI substrate formed by a bonding technique, thermal oxide films (side insulating films) are formed on the sides of the trench, and then a gap between the side insulating films formed on the sides of the trench is filled with polycrystalline silicon, thereby forming a trench isolation region.

However, if a high voltage is applied between active regions at both sides of the isolation region in the known semiconductor device disclosed in the above publication, the high voltage is intensively applied to the thermal oxide films (thermal oxide films) in the isolation region, so that the device exhibits low breakdown strength. On the other hand, if the thermal oxide films are made thick enough, the dielectric breakdown strength increases, but crystal defects occur in semiconductor crystal in the active regions. These crystal defects occur because when the thick thermal oxide films are formed in a thermal oxidation process performed for a long time, the volume of the thermal oxide films increases so that the active regions undergo a large stress. The occurrence of the crystal defects might deteriorate the current-driving capability of the transistors.

In a semiconductor device having an isolation region formed by filling the entire trench with an insulator such as a CVD oxide film, a large stress resulting from the difference in thermal expansion coefficient between the insulator and a semiconductor might also be applied to active regions.

SUMMARY OF THE INVENTION

It is therefore an object of the present invention is to increase the dielectric breakdown strength by relaxing the concentration of applied voltage in insulating films formed on the sides of a trench, while suppressing the generation of stress in active regions, in a semiconductor device using an SOI substrate and having a trench isolation.

An inventive semiconductor device is a semiconductor device using an SOI substrate and includes; side insulating films covering the sides of a trench; and a polycrystalline semiconductor region interposed between the side insulating films and having a pn junction extending along the depth direction of the trench.

In this device, if a voltage is applied between active regions at both sides of the isolation region, the voltage is partly applied to a depletion layer created in the pn junction as well as to the side insulating films. Accordingly, even if the width of the isolation region is small and the side insulating films are thin, the semiconductor device exhibits high breakdown strength. As a result, it is possible to increase the breakdown strength, while suppressing the generation of stress in the active regions.

The polycrystalline semiconductor region may include: two polycrystalline semiconductor layers of a first conductivity type covering the respective sides of the side insulating films; and a polycrystalline semiconductor layer of a second conductivity type interposed between the polycrystalline semiconductor layers of the first conductivity type. Then, even if a high voltage is applied to any one of the active regions, high breakdown strength can be exhibited as intended.

The polycrystalline semiconductor layers of the first conductivity type preferably have the shape of sidewalls formed by etching back a polycrystalline semiconductor layer. Then, it is not necessary to provide a margin in the horizontal dimension of the first polycrystalline semiconductor layer of the first conductivity type in consideration of mask misalignment. As a result, a structure suitable for a miniaturized semiconductor device is obtained.

In the case where the semiconductor layer is made of single-crystalline silicon, the polycrystalline semiconductor region is preferably made of polycrystalline silicon.

An inventive method for fabricating a semiconductor device includes the steps of: forming a trench in a region to be an isolation region in a semiconductor layer included in an SOI substrate; then forming side insulating films; and forming, between the side insulating films on the sides of the trench, polycrystalline semiconductor layers of a first conductivity type covering respective sides of the side insulating films and a second polycrystalline semiconductor layer of a second conductivity type interposed between the polycrystalline semiconductor layers of the first conductivity type.

With this method, pn junctions extending along the depth direction of the trench are respectively created at the interfaces between each of the two polycrystalline semiconductor layers of the first conductivity type and the polycrystalline semiconductor layer of the second conductivity type interposed therebetween. Accordingly, a semiconductor device exhibiting high breakdown strength due to the effect described above is obtained.

Examples of methods for forming the polycrystalline semiconductor layers of the first conductivity type and the second polycrystalline semiconductor layer of the second conductivity type include a method of implanting ions of an impurity of the first conductivity type and implanting ions of an impurity of the second conductivity type, after filling the trench with a non-doped polycrystalline semiconductor film, and a method of utilizing CVD including in-situ doping.

DESCRIPTION OF THE PREFERRED EMBODIMENTS

Embodiment 1

(Structure of Semiconductor Device)

Figure 1:
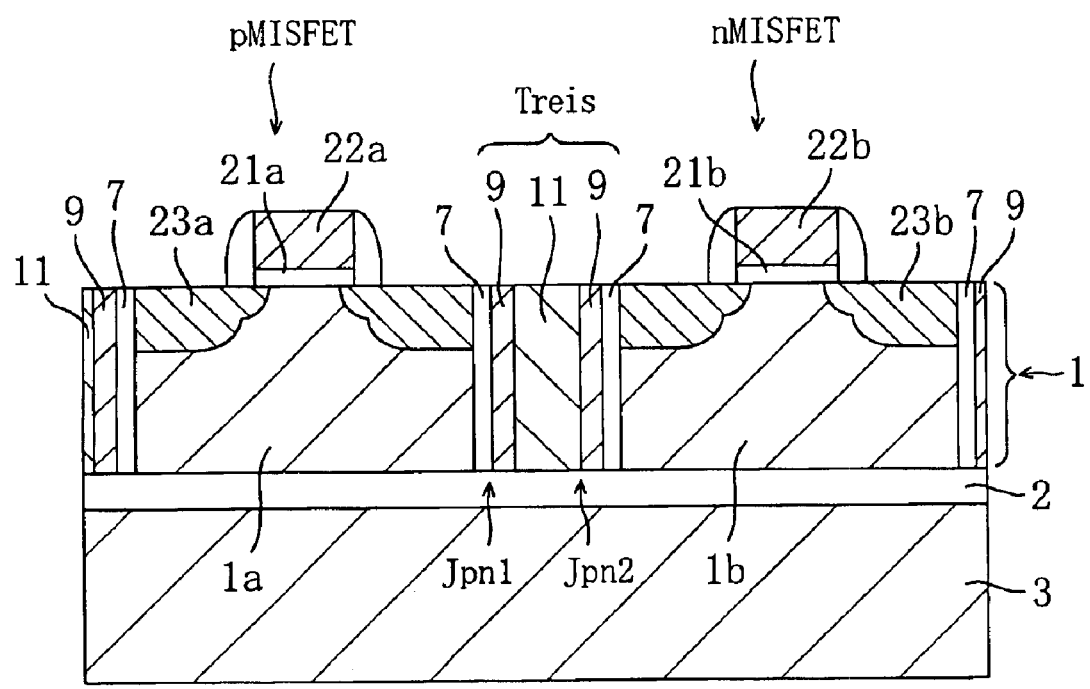
FIG. 1 is a cross-sectional view showing a structure of a semiconductor device using an SOI substrate according to a first embodiment of the present invention.

FIG. 1 is a cross-sectional view showing a structure of a semiconductor device using an SOI substrate according to a first embodiment of the present invention. As shown in FIG. 1, the semiconductor device of this embodiment is formed using an SOI substrate which includes: a semiconductor substrate 3 made of single-crystalline silicon; an insulating layer 2 with a thickness of 900 nm provided on the principal surface of the semiconductor substrate 3; and a semiconductor layer 1 with a thickness of 3.5 µm made of single-crystalline silicon and provided on the insulating layer 2.

The semiconductor layer 1 is divided into a large number of active regions 1a, 1b, . . . by a trench isolation region Treis. FIG. 1 shows only two of the active regions, i.e., the active regions 1a and 1b. A p-channel type MISFET (hereinafter, referred to as a pMISFET) is provided in the active region 1a, and an n-channel type MISFET (hereinafter, referred to as an nMISFET) is provided in the active region 1b. A substrate region in the active region 1a contains an n-type impurity (phosphorus or arsenic) at a low concentration and a substrate region of the active region 1b contains a p-type impurity (boron) at a low concentration.

As elements for the pMISFET, a gate insulating film 21a made of, for example, a silicon oxide film or a silicon oxynitride film and a gate electrode 22a of polycrystalline silicon containing a p-type impurity (boron) are provided on the active region 1a. Source/drain regions 23a constituted by extension regions containing a p-type impurity (boron) at a low concentration and highly doped source/drain regions containing a p-type impurity (boron) at a high concentration are formed in part of the active region 1a located below the sides of the gate electrode 22a with the gate electrode 22a sandwiched therebetween.

As elements for the nMISFET, a gate insulating film 21b made of, for example, a silicon oxide film or a silicon oxynitride film and a gate electrode 22b of polycrystalline silicon containing an n-type impurity (phosphorus or arsenic) are provided on the active region 1b. Source/drain regions 23b constituted by extension regions containing an n-type impurity (phosphorus or arsenic) at a low concentration and highly doped regions containing an n-type impurity (phosphorus or arsenic) at a high concentration is formed in part of the active region 1b located below the sides of the gate electrode 22b with the gate electrode 22b sandwiched therebetween.

Now, the structure of the trench isolation region Treis, which is a feature of this embodiment, will be described. The trench isolation region Treis of this embodiment includes: two side insulating films 7 with a horizontal thickness of 100 nm made of a silicon oxide film (thermal oxide film) and covering the sides of a trench which penetrates the semiconductor layer 1 to reach the insulating layer 2; two polycrystalline semiconductor layers 9 of a first conductivity type covering the respective sides of the insulating films 7; and a polycrystalline semiconductor layer 11 of a second conductivity type filling a gap between the polycrystalline semiconductor layers 9 of the first conductivity type. In this embodiment, each of the polycrystalline semiconductor layers 9 of the first conductivity type is an n-type polycrystalline silicon film with a horizontal thickness of 300 nm containing an n-type impurity (e.g., phosphorus or arsenic) at a concentration of about $5 \times 10^{16}$ cm$^{-3}$, and the polycrystalline semiconductor layer 11 of the second conductivity type is a p-type polycrystalline silicon film containing a p-type impurity (e.g., boron) at a concentration of about $5 \times 10^{16}$ cm$^{-3}$. Two pn junctions Jpn1 and Jpn2 are formed between each of the polycrystalline semiconductor layers 9 of the first conductivity type and the polycrystalline semiconductor layer 11 of the second conductivity type, extending vertically (i.e., along the depth direction of the trench). That is to say, the polycrystalline semiconductor layers 9 of the first conductivity type and the polycrystalline semiconductor layer 11 of the second conductivity type constitute the semiconductor region including the pn junctions Jpns extending along the depth direction of the trench.

Note that even if each of the polycrystalline semiconductor layers 9 of the first conductivity type is a p-type polycrystalline silicon film and the polycrystalline semiconductor layer 11 of the second conductivity type is an n-type polycrystalline silicon film, effects of this embodiment, which will be describe later, are achieved because the two pn junctions extending along the depth direction are formed between each of the polycrystalline semiconductor layers 9 of the first conductivity type and the polycrystalline semiconductor layer 11 of the second conductivity type. The horizontal dimension of the trench is not always constant, the horizontal dimension of the polycrystalline semiconductor layer 11 of the second conductivity type also changes in different parts.

In the semiconductor device of this embodiment, the polycrystalline semiconductor layers 9 of the first conductivity type and the polycrystalline semiconductor layer 11 of the second conductivity type are provided in the trench isolation region Treis for isolating the active regions 1a and 1b from each other, so that the two pn junctions Jpn1 and Jpn2 extending along the depth direction of the trench are formed. With this structure, even if a voltage is applied between the source/drain regions 23a and 23b in the respective active regions 1a and 1b, a depletion layer expands in one of the pn junctions Jpn1 and Jpn2. For example, a high voltage is applied such that the potential at the active region 1a is higher than that at the active region 1b, a depletion layer expands in the pn junction Jpn2, and the voltage is also partly applied to the depletion layer so that the concentration of electric field in the side insulating films 7 is relaxed. Accordingly, even if the width of the trench isolation region Treis is small and the side insulating films 7 are thin, sufficiently high breakdown strength is achieved. As a result, in the semiconductor device of this embodiment, it is possible to obtain high breakdown strength, while suppressing the generation of stress in the active regions 1a and 1b.

The SOI substrate used in this embodiment may be formed by using a technique such as a publicly known bonding technique, a technique for providing a BOX layer by implanting oxygen ions or a technique for epitaxially growing a semiconductor layer on an insulating substrate. Any of these techniques can attain the effects described above.

A semiconductor material constituting the SOI substrate is not limited to silicon. The polycrystalline semiconductor layers 9 and 11 of the first and second conductivity types are preferably made of the same semiconductor material constituting the semiconductor layer 1. If the polycrystalline semiconductor layers 9 and 11 and the semiconductor layer 1 are made of the same semiconductor material, almost no difference in thermal expansion coefficient occurs between the polycrystalline semiconductor layers 9 and 11 and the semiconductor layer 1. This is because the generation of stress in the active regions 1a and 1b can be further suppressed.

(Method for Fabricating Semiconductor Device)

FIGS. 2A through 4B are cross-sectional views showing respective process steps for fabricating the semiconductor device of the first embodiment.

Figure 2A:
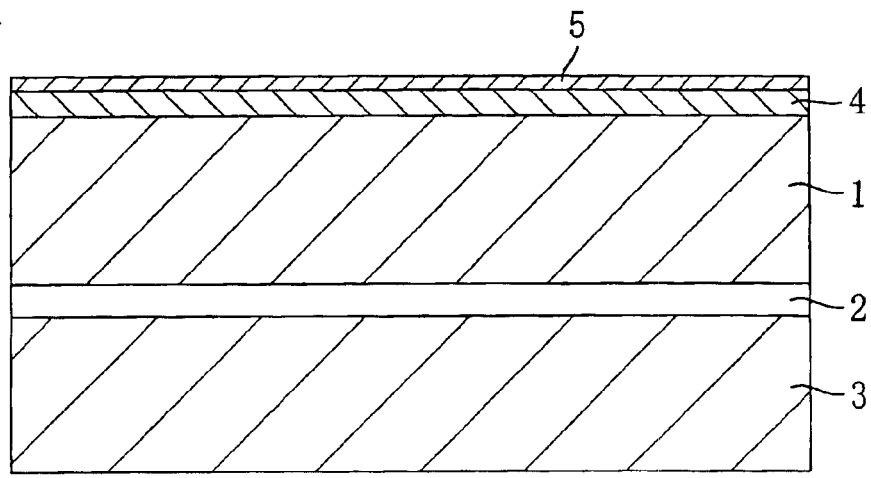
FIGS. 2A through 2C are cross-sectional views showing respective process steps for fabricating the semiconductor device of the first embodiment up to a process step of forming side insulating films.

First, in a process step shown in FIG. 2A, a pad oxide film 4 is formed by a thermal oxidation process or a CVD process on the principal surface of a semiconductor layer 1 using an SOI substrate including the semiconductor layer 1, a semiconductor substrate 3 and an insulating layer 2 interposed between the semiconductor layer 1 and the semiconductor substrate 3. Then, a nitride film 5 to serve as an etch stopper is formed by a CVD process on the pad oxide film 4.

Figure 2B:
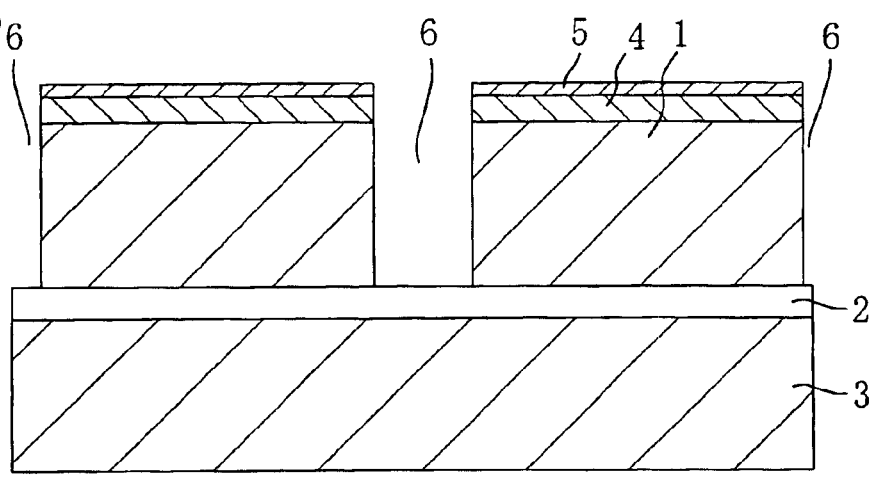

Next, in a process step shown in FIG. 2B, anisotropic dry etching is performed using a resist film (not shown) formed by photolithography as a mask to pattern the nitride film 5 and the pad oxide film 3, thereby forming an opening for trench. Then, anisotropic dry etching is performed using the patterned nitride films 5 as a mask, thereby forming a trench 6 which penetrates the semiconductor layer 1 to reach the insulating layer 2.

Figure 2C:
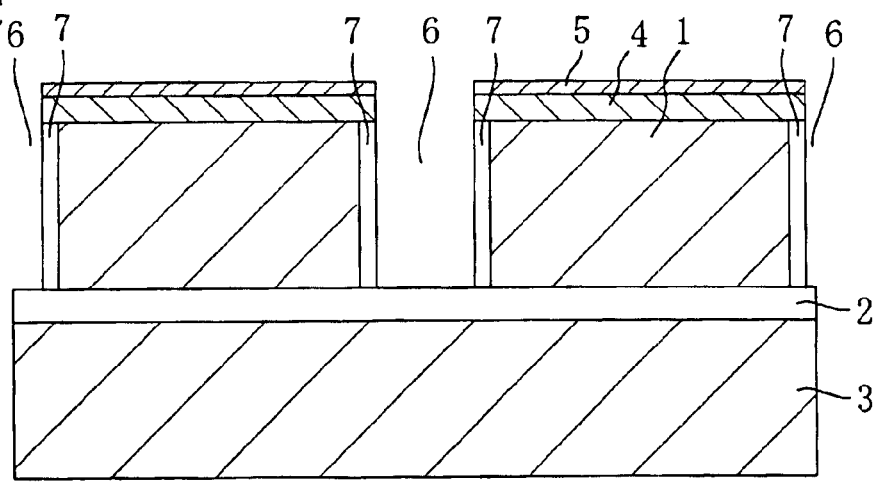

Thereafter, in a process step shown in FIG. 2C, side insulating films 7 (thermal oxide films) covering the sides of the trench 6 (the sides of the semiconductor layer 1) are formed by a thermal oxidation process.

Figure 3A:
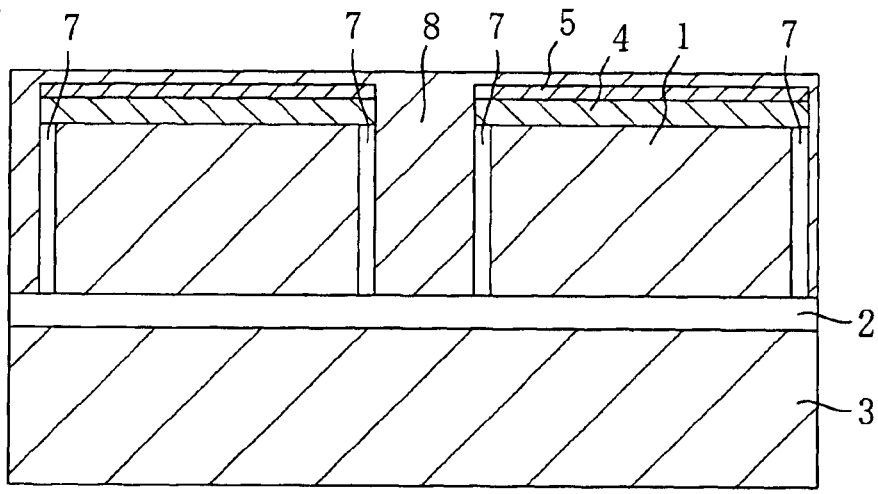
FIGS. 3A through 3C are cross-sectional views showing respective process steps for fabricating the semiconductor device of the first embodiment up to a process step of forming an implantation mask.

Then, in a process step shown in FIG. 3A, a non-doped polycrystalline silicon film 8 is deposited by a CVD process over the substrate. In this way, the trench 6 is filled with the non-doped polycrystalline silicon film 8.

Subsequently, in a process step shown in FIG. 3B, anisotropic dry etching is performed using the nitride films 5 as an etch stopper, thereby etching back the non-doped polycrystalline silicon film 8. In this way, part of the non-doped polycrystalline silicon film 8 extending off the trench 6 is removed. Then, ion implantation of an n-type impurity (e.g., phosphorus) is performed using the nitride films 5 and the pad oxide films 4 as a mask, thereby changing the non-doped polycrystalline silicon film 8 into a polycrystalline semiconductor layer 9 of a first conductivity type. In this case, the ion implantation is performed in three stages: at a dose of $2.9 \times 10^{12}$ cm$^{-2}$ with an implantation energy of 800 keV; at a dose of $3.2 \times 10^{12}$ cm$^{-2}$ with an implantation energy of 200 keV; and at a dose of $3.8 \times 10^{12}$ cm$^{-2}$ with an implantation energy of 4000 keV. At this time, the trench 6 is filled with the polycrystalline semiconductor layer 9 of the first conductivity type.

Figure 3B:
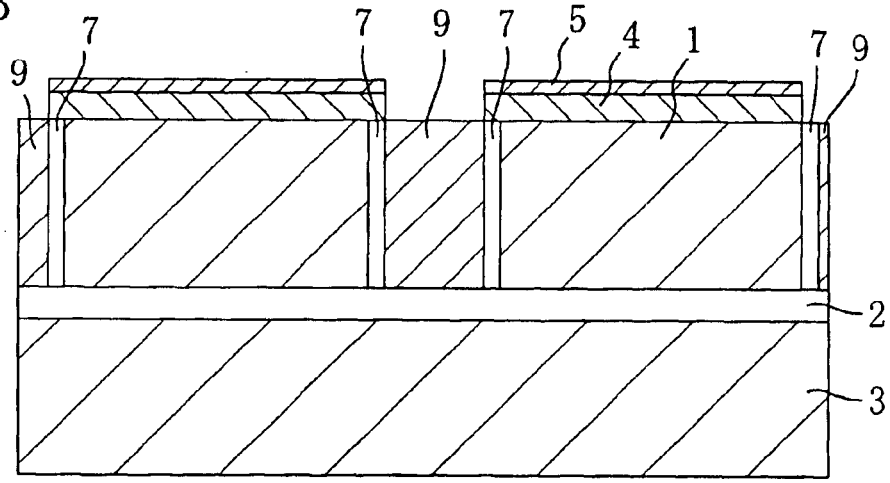
Figure 3C:
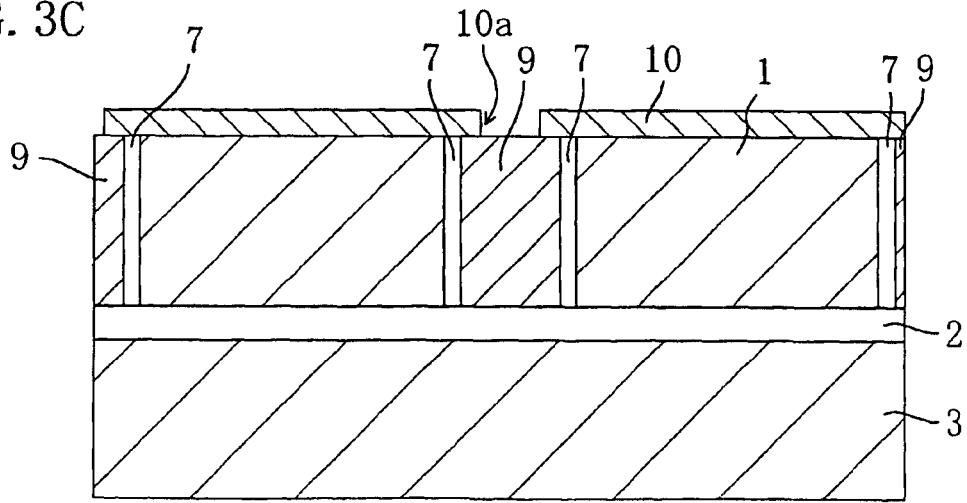

Then, in a process step shown in FIG. 3C, the nitride films 5 and the pad oxide films 3 are removed, and then an oxide film 10 for an implantation mask is deposited over the substrate. Subsequently, the oxide film 10 is patterned by photolithography and dry etching, thereby forming an opening 10a having a width smaller than the width of the trench 6.

Figure 4A:
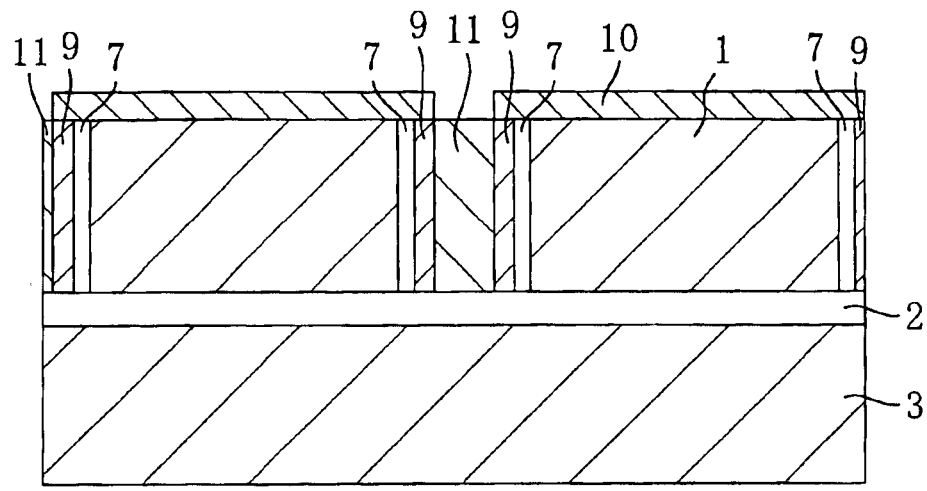
FIGS. 4A and 4B are cross-sectional views showing the latter part of process steps for fabricating the semiconductor device of the first embodiment.

Next, in a process step shown in FIG. 4A, ion implantation of a p-type impurity (e.g., boron) is performed using the oxide film 10 as a mask, thereby changing a part (a center portion) of the polycrystalline semiconductor layer 9 of the first conductivity type formed in the trench 6 into a polycrystalline semiconductor layer 11 of a second conductivity type. In this case, the ion implantation is performed in three stages: at a dose of $1.4 \times 10^{12}$ cm$^{-2}$ with an implantation energy of 400 keV; at a dose of $1.5 \times 10^{12}$ cm$^{-2}$ with an implantation energy of 1200 keV; and at a dose of $1.9 \times 10^{12}$ cm$^{-2}$ with an implantation energy of 2000 keV.

Figure 4B:
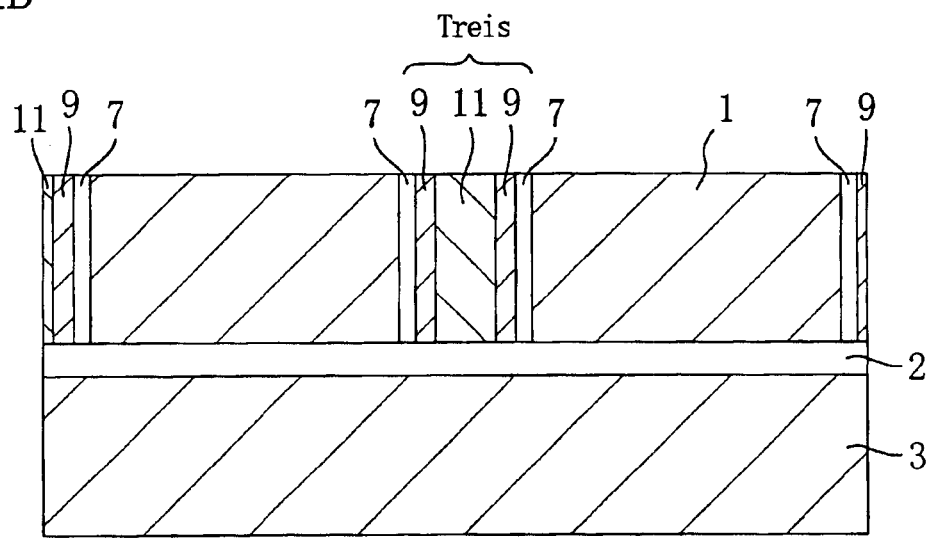

Lastly, in a process step shown in FIG. 4B, the patterned oxide films 10 are removed by etching. In this manner, a trench isolation region Treis including the side insulating films 7, the polycrystalline semiconductor layers 9 of the first conductivity type and the polycrystalline semiconductor layer 11 of the second conductivity type is formed.

Although the subsequent process steps are not shown, a gate insulating film, a gate electrode, an extension region, a sidewall and a highly doped region are formed with a general CMOS process, thus completing a semiconductor device having a structure shown in FIG. 1.

With the method for fabricating a semiconductor device according to this embodiment, the structure of the semiconductor device shown in FIG. 1 can be easily obtained.

(Fabrication Method According to Modified Example of Embodiment 1)

In the first embodiment, in order to fill the trench 6 with the polycrystalline semiconductor layer 9 of the first conductivity type, the non-doped polycrystalline silicon film 8 is deposited over the substrate in the process step shown in FIG. 3A, and then ion implantation of an n-type impurity is performed in the process step shown in FIG. 3B, thereby changing the non-doped polycrystalline silicon film 8 into the polycrystalline semiconductor layer 9 of the first conductivity type.

On the other hand, in an modified example of the first embodiment, a polycrystalline silicon film containing an n-type impurity is deposited over the substrate by CVD including in-situ doping with an n-type impurity in the process step shown in FIG. 3A, and then part of the polycrystalline silicon film extending off the transistor 6 is removed by dry etching, thereby forming a polycrystalline semiconductor layer 9 of the first conductivity type.

The other process steps are the same as those in the first embodiment shown in FIG. 2A through FIG. 4B. In this modified example, the same effects as in the first embodiment can also be achieved. In particular, with the method of this modified example, the polycrystalline semiconductor layer 9 of the first conductivity type in which the impurity is diffused more uniformly than in the first embodiment is obtained, so that variation in breakdown strength can be suppressed.

Embodiment 2

In the method for fabricating a semiconductor device according to the first embodiment or the modified example of the first embodiment, part of the polycrystalline semiconductor layer 9 of the first conductivity type is changed into the polycrystalline semiconductor layer 11 of the second conductivity type using an ion implantation technique, in order to form the polycrystalline semiconductor layer 11. On the other hand, according to a method for fabricating a semiconductor device according to a second embodiment of the present invention, a process of forming a polycrystalline semiconductor layer of the second conductivity type with CVD including in-situ doping is adopted.

Figure 5A:
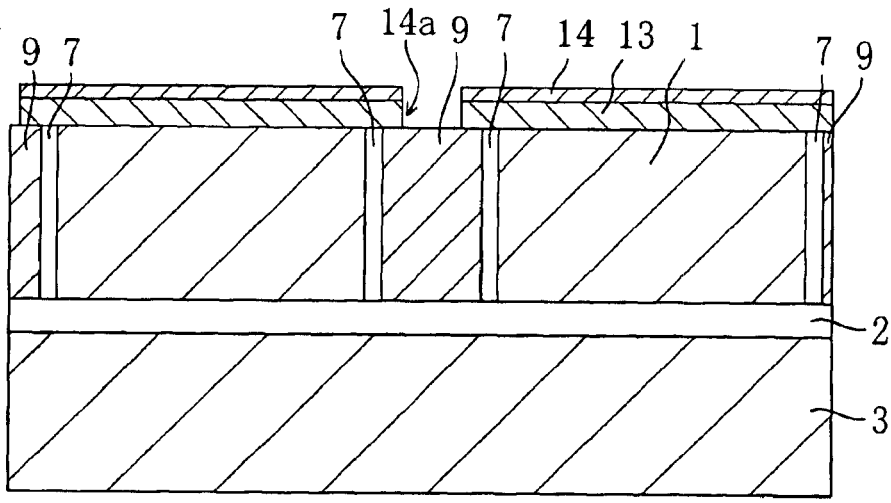
FIGS. 5A through 5C are cross-sectional views showing respective process steps for fabricating a semiconductor device according a second embodiment of the present invention.
Figure 5B:
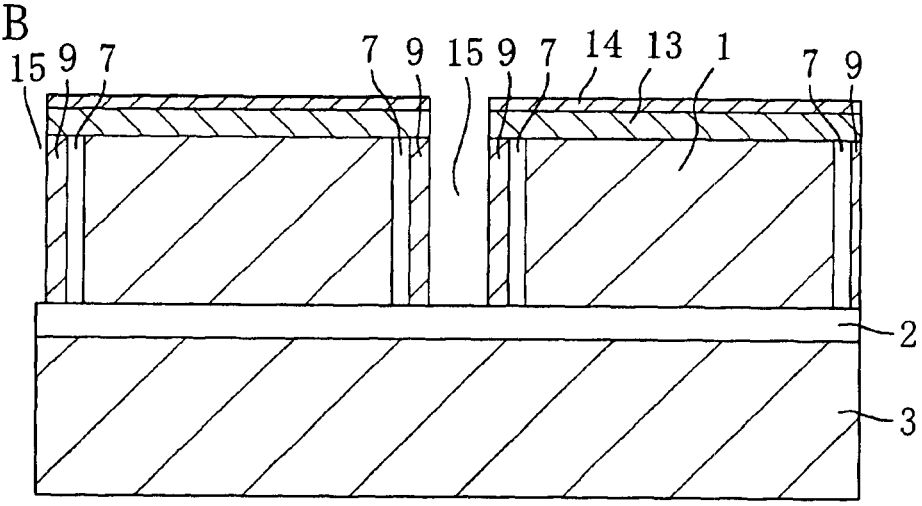
Figure 5C:
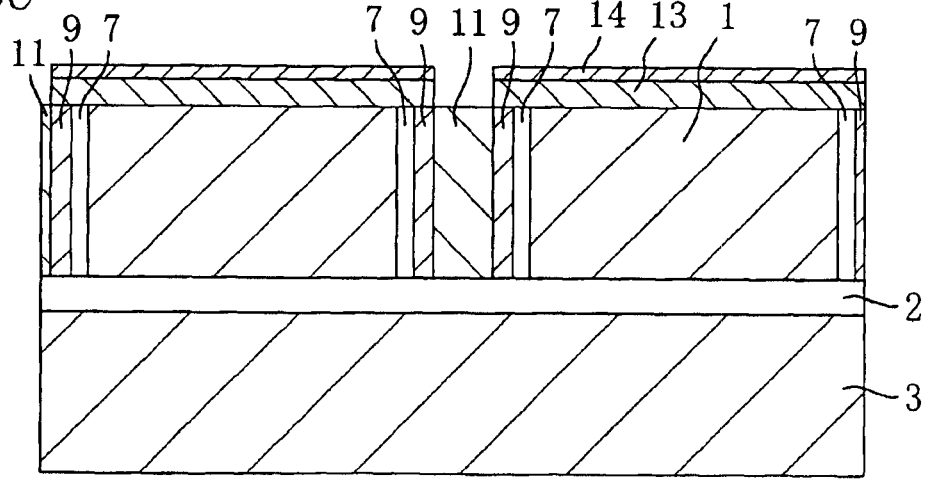

FIGS. 5A through 5C are cross-sectional views showing respective process steps for fabricating a semiconductor device of the second embodiment. In this embodiment, the process steps in the first embodiment or the modified example of the first embodiment shown in FIGS. 2A through 3B are performed before a process step shown in FIG. 5A, thereby forming pad oxide films 4, nitride films 5, a trench 6, side insulating films 7 and a polycrystalline semiconductor layer 9 of the first conductivity type. It should be noted that the process steps before the process step shown in FIG. 5A are not shown for the purpose of eliminating redundancy.

In a process step shown in FIG. 5A, the pad oxide films 4 and the nitride films 5 are removed, and then a pad oxide film 13 and a nitride film 14 are newly deposited over the substrate. Subsequently, the nitride film 14 and the pad oxide film 13 are patterned by photolithography and dry etching, thereby forming an opening 14a having a width smaller than the width of the trench 6.

Next, in a process step shown in FIG. 5B, a center portion of the polycrystalline semiconductor layer 9 of the first conductivity type is removed using the patterned nitride films 14 as a mask, thereby forming a small trench 15 that reaches the insulating layer 2.

Then, in a process step shown in FIG. 5C, a p-type polycrystalline silicon film is deposited over the substrate by CVD including in-situ doping with a p-type impurity, thereby filling the small trench 15 with the p-type polycrystalline silicon film. Subsequently, part of the p-type polycrystalline silicon film extending off the small trench 15 is removed by dry etching, thereby forming a polycrystalline semiconductor layer 11 of a second conductivity type. In this case, the patterned nitride films 14 are used as an etch stopper. In this manner, a trench isolation region Treis including the side insulating films 7, the polycrystalline semiconductor layers 9 of the first conductivity type and the polycrystalline semiconductor layer 11 of the second conductivity type is formed.

Although the subsequent process steps are not shown, a gate insulating film, a gate electrode, an extension region, a sidewall and a highly doped region are formed with a general CMOS process, thus completing a semiconductor device having a structure shown in FIG. 1.

Embodiment 3
(Structure of Semiconductor Device)

Figure 6:
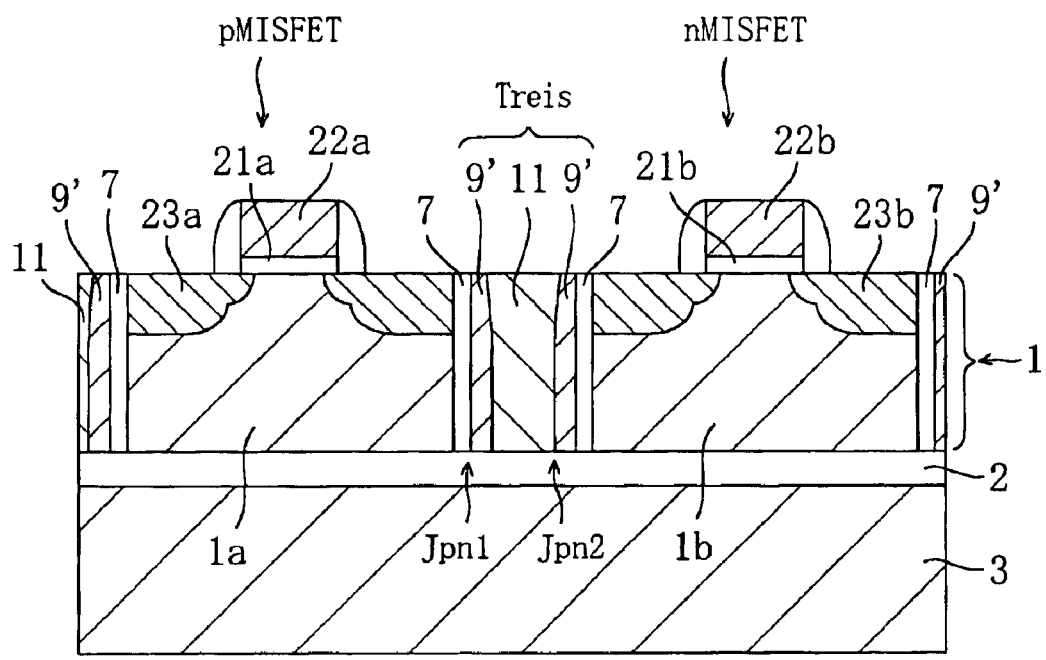
FIG. 6 is a cross-sectional view showing a structure of a semiconductor device using an SOI substrate according to a third embodiment of the present invention.

FIG. 6 is a cross-sectional view showing a structure of a semiconductor device using an SOI substrate according to a third embodiment of the present invention. As shown in FIG. 6, the semiconductor device of this embodiment is formed using an SOI substrate including: a semiconductor substrate 3 of single-crystalline silicon; an insulating layer 2 with a thickness of 900 nm provided on the principal surface of the semiconductor substrate 3; and a semiconductor layer 1 with a thickness of 3.5 $\mu$m m made of single-crystalline silicon and provided on the insulating layer 2.

The semiconductor layer 1 is divided into a large number of active regions 1a, 1b, . . . by a trench isolation region Treis. FIG. 6 shows only two of the active regions, i.e., the active regions 1a and 1b. A pMISFET having the same structure as in the first embodiment is provided in the active region 1a, and an nMISFET having the same structure as in the first embodiment is provided in the active region 1b. A substrate region in the active region 1a contains an n-type impurity (phosphorus or arsenic) at a low concentration, and a substrate region of the active region 1b contains a p-type impurity (boron) at a low concentration.

Now, the structure of the trench isolation region Treis, which is a feature of this embodiment, will be described. The trench isolation region Treis of this embodiment includes: side insulating films 7 which cover the sides of a trench reaching the insulating layer 2 through the semiconductor layer 1, have a horizontal thickness of 100 nm at the bottom of the trench, and are made of a silicon oxide film (thermal oxide film); polycrystalline semiconductor layers 9' of a first conductivity type having the shape of sidewalls and covering the respective sides of the side insulating films 7 on the sides of the trench 6; a polycrystalline semiconductor layer 11 of a second conductivity type filling a gap between the polycrystalline semiconductor layers 9' of the first conductivity type located at the sides of the trench 6. In this embodiment, each of the polycrystalline semiconductor layers 9' of the first conductivity type is an n-type polycrystalline silicon film having a horizontal thickness of 300 nm at the bottom of the trench and containing an n-type impurity (e.g., phosphorus or arsenic), while the polycrystalline semiconductor layer 11 of the second conductivity type is a p-type polycrystalline silicon film containing a p-type impurity (e.g., boron). The polycrystalline semiconductor layers 9' of the first conductivity type of this embodiment are formed by etching back the polycrystalline silicon film. Therefore, two pn junctions Jpn1 and Jpn2 are formed between each of the polycrystalline semiconductor layers 9' of the first conductivity type and the polycrystalline semiconductor layer 11 of the second conductivity type, extending vertically with tilt (i.e., along the depth direction with small slants).

In this embodiment, even if each of the polycrystalline semiconductor layers 9' of the first conductivity type is a p-type polycrystalline silicon film and the polycrystalline semiconductor layer 11 of the second conductivity type is an n-type polycrystalline silicon film, effects of this embodiment, which will be describe later, are achieved because the two pn junctions extending along the depth direction are formed between the polycrystalline semiconductor layers 9' of the first conductivity type and the polycrystalline semiconductor layer 11 of the second conductivity type. Since the horizontal dimension of the trench is not necessarily constant, the horizontal dimension of the polycrystalline semiconductor layer 11 of the second conductivity type also changes in different parts.

In the semiconductor device of this embodiment, the polycrystalline semiconductor layers 9' of the first conductivity type and the polycrystalline semiconductor layer 11 of the second conductivity type are provided in the trench isolation region Treis for isolating the active regions 1a and 1b from each other, so that the two pn junctions Jpn1 and Jpn2 extending along the depth direction with small slants are formed. With this structure, even if a voltage is applied between the source/drain regions 23a and 23b in the respective active regions 1a and 1b, a depletion layer expands in one of the pn junctions Jpn1 and Jpn2. As a result, in the semiconductor device of this embodiment, it is possible to obtain high breakdown strength, while suppressing the generation of stress in the active regions 1a and 1b, as in the first embodiment.

In particular, in this embodiment, the polycrystalline semiconductor layers 9' of the first conductivity type are self-aligned by etching back the polycrystalline silicon film so that the thickness of the polycrystalline semiconductor layers 9' can be set without providing a margin in consideration of mask misalignment, thus providing a structure advantageous especially to miniaturization of a semiconductor device.

(Method for Fabricating Semiconductor Device)

Figure 7A:
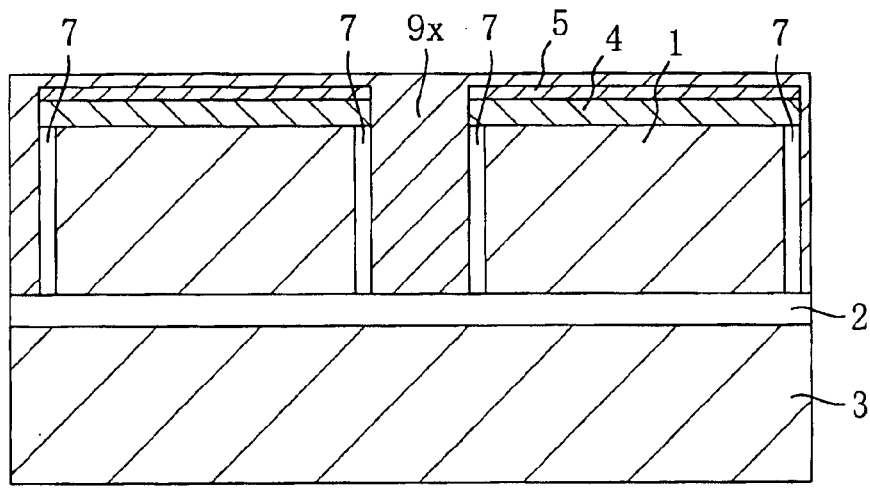
FIGS. 7A through 7C are cross-sectional views showing respective process steps for fabricating the semiconductor device of the third embodiment.
Figure 7B:
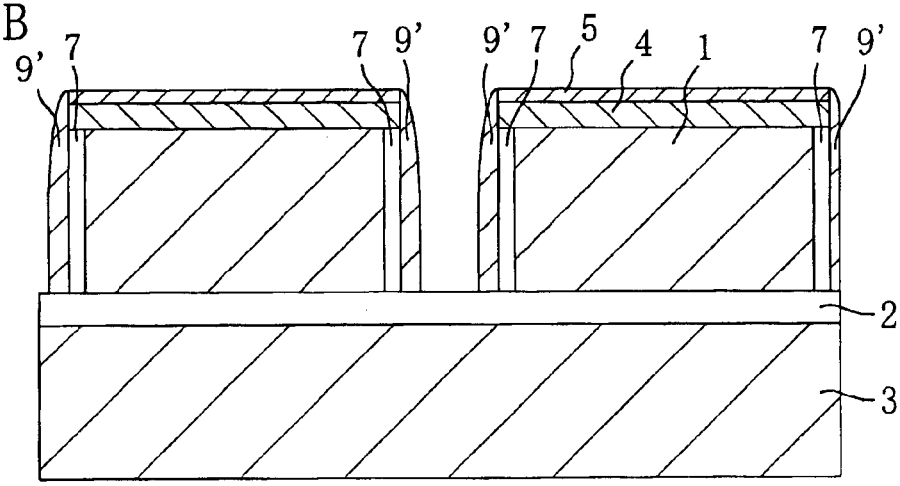
Figure 7C:
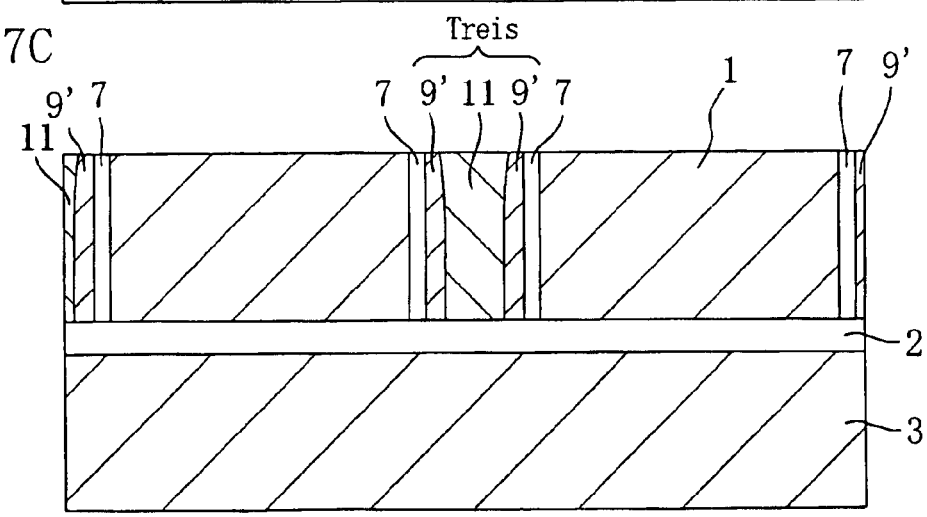

FIGS. 7A through 7C are cross-sectional views showing respective process steps for fabricating a semiconductor device according to a third embodiment of the present invention. In this embodiment, the process steps in the first embodiment shown in FIGS. 2A through 2C are performed before a process step shown in FIG. 7A, thereby forming pad oxide films 4, nitride films 5, a trench 6 and side insulating films 7. It should be noted that the process steps before the process step shown in FIG. 7A are not shown for the purpose of eliminating redundancy.

First, in a process step shown in FIG. 7A, a polycrystalline semiconductor film 9x of a first conductivity type is deposited over the substrate by CVD including in-situ doping with an n-type impurity. In this way, the trench 6 is filled with the polycrystalline semiconductor film 9x of the first conductivity type. The polycrystalline semiconductor film 9x may be formed by depositing a non-doped polycrystalline silicon film and then performing implantation of an n-type impurity.

Next, in a process step shown in FIG. 7B, anisotropic dry etching is performed using the nitride films 5 as an etch stopper, thereby etching back the n-type polycrystalline semiconductor film 9x to expose the insulating layer 2. In this way, polycrystalline semiconductor layers 9' covering the sides of the trench 6 (i.e., respective sides of the side insulating films 7, pad oxide films 4 and nitride films 5) are formed.

Then, in a process step shown in FIG. 7C, a p-type polycrystalline silicon film is deposited by CVD including in-situ doping with a p-type impurity to a thickness of 4 $\mu$m over the substrate, thereby filling the trench 6 with the p-type polycrystalline silicon film. Thereafter, part of the p-type polycrystalline silicon film extending off the trench 6, the nitride films 5 and the pad oxide films 4 are removed by chemical mechanical polishing (CMP) so that the semiconductor layer 1 is exposed, thereby forming a polycrystalline semiconductor layer 11 of a second conductivity type. In this manner, a trench isolation region Treis including the side insulating films 7, the polycrystalline semiconductor layers 9' of the first conductivity type and the polycrystalline semiconductor layer 11 of the second conductivity type is formed.

Although the subsequent process steps are not shown, a gate insulating film, a gate electrode, an extension region, a sidewall and a highly doped region are formed with a general CMOS process, thus completing a semiconductor device having a structure shown in FIG. 6.

With the fabrication method of this embodiment, the polycrystalline semiconductor layers 9' of the first conductivity type and the polycrystalline semiconductor layer 11 of the second conductivity type are formed without using a process step of forming a mask, thus reducing the fabrication cost. In addition, since the polycrystalline semiconductor layers 9' of the first conductivity type are self-aligned as described above, the thickness of the polycrystalline semiconductor layers 9' of the first conductivity type can be set without providing a margin for a mask for the formation of the trench 6 in consideration of misalignment of the mask. Accordingly, the thickness of the polycrystalline semiconductor layers 9' of the first conductivity type can be reduced to about 100 nm, thus providing a structure advantageous to miniaturization of a semiconductor device.

In the foregoing embodiments, even if an intrinsic (non-doped) polycrystalline semiconductor layer is interposed between each of the polycrystalline semiconductor layers 9 (or 9') of the first conductivity type and the polycrystalline semiconductor layer 11 of the second conductivity type which form the pn junctions Jpn1 and Jpn2, an effect of the present invention, i.e., a structure for attaining high breakdown strength by utilizing a depletion layer, can be obtained.

In addition, in a case where it is fixed which one of the voltages at the two active regions 1a and 1b located at both sides of the trench isolation region Treis is high, at least one pn junction is enough. In general, however, the region which receives a high voltage is switched between the active regions 1a and 1b depending on the operating state of the semiconductor device. Accordingly, to partly apply the voltage utilizing a depletion layer in either case, two or more pn junctions are preferably provided in a trench isolation region.

Furthermore, four or more pn junctions may be provided in a semiconductor region. For example, if the method of the third embodiment is adopted, polycrystalline semiconductor layers 9' of a first conductivity type having the shape of sidewalls are formed in the process step shown in FIG. 7B, and then a polycrystalline semiconductor film of the first conductivity type is deposited and etched back and polycrystalline semiconductor layers of a second conductivity type having the shape of sidewalls are formed. Then, the remaining gap is filled with a polycrystalline semiconductor layer of the first conductivity type. In this manner, a polycrystalline semiconductor region constituted by three sets of polycrystalline semiconductor layers of the first conductivity type and two sets of polycrystalline semiconductor layers of the second conductivity type is formed. In such a case, four pn junctions are present in the polycrystalline semiconductor region. That is to say, by alternately forming polysilicon semiconductor layers of the first conductivity type having the shape of sidewalls and polycrystalline semiconductor layers of the second conductivity type having the shape of sidewalls, a polycrystalline semiconductor region including a large number of pn junctions can be formed. In the same manner, if the first or second embodiment is adopted, a polycrystalline semiconductor region including four or more pn junctions can also be formed by repeating ion implantation a large number of times or repeating formation of a small trench and CVD including in-situ doping a large number of times.

The side insulating films 7 are not necessarily made of an oxide film and may be made of an oxynitride film or a nitride film, for example. A CVD oxide film may be used for the side insulating films 7, instead of a thermal oxidation film. However, in such a case, it is necessary not to have a large stress generated in the active regions 1a and 1b.

What is claimed is:

1. A semiconductor device comprising:
   an insulating layer;
   a semiconductor layer provided on the insulating layer; and
   an isolation region for dividing the semiconductor layer into a plurality of active regions for forming semiconductor elements therein,
   wherein each of the isolation regions includes:
   a trench penetrating the semiconductor layer to reach the insulating layer;
   side insulating films covering respective sides of the trench; and
   a polycrystalline semiconductor region interposed between the side insulating films and having a pn junction extending along the depth direction of the trench,
   wherein the polycrystalline semiconductor region includes:
   polycrystalline semiconductor layers of a first conductivity type covering respective sides of the side insulating films; and
   a polycrystalline semiconductor layer of a second conductivity type interposed between the polycrystalline semiconductor layers of the first conductivity type, and pn junctions extending along the depth direction of the trench are formed between each of the polycrystalline semiconductor layers of the first conductivity type and the polycrystalline semiconductor layer of the second conductivity type.

2. The semiconductor device of claim 1, wherein the polycrystalline semiconductor layers of the first conductivity type have the shape of sidewalls formed by etching back a polycrystalline semiconductor film.

3. The semiconductor device of claim 1, wherein the semiconductor layer is made of single-crystalline silicon, and the polycrystalline semiconductor region is made of polycrystalline silicon.

4. A method for fabricating a semiconductor device, the method comprising the steps of:

a) forming a trench reaching the insulating layer through a region to be an isolation region in a semiconductor layer provided on an insulating layer included in an SOI substrate;

b) forming side insulating films covering respective sides of the trench; and c) forming, between the side insulating films on the sides of the trench, polycrystalline semiconductor layers of a first conductivity type and a polycrystalline semiconductor layer of a second conductivity type, the polycrystalline semiconductor layers of the first conductivity type covering respective sides of the side insulating films, the second polycrystalline semiconductor layer of the second conductivity type being interposed between the polycrystalline semiconductor layers of the first conductivity type.

5. The method of claim 4, wherein the step c) includes the steps of:

filling the trench with a non-doped polycrystalline semiconductor film;

implanting impurity ions of the first conductivity type into the non-doped polycrystalline semiconductor film, thereby changing the non-doped polycrystalline semiconductor film into a polycrystalline semiconductor layer of the first conductivity type; and performing ion implantation of an impurity of the second conductivity type using an implantation mask covering side portions of the polycrystalline semiconductor layer of the first conductivity type, thereby changing part of the polycrystalline semiconductor layer of the first conductivity type except for the side portions thereof into a polycrystalline semiconductor layer of the second conductivity type.

6. The method of claim 4, wherein the step c) includes the steps of:

filling the trench with a polycrystalline-semiconductor film of the first conductivity type by CVD including in-situ doping with an impurity of the first conductivity type; and performing ion implantation of an impurity of the second conductivity type using an implantation mask covering side portions of the polycrystalline semiconductor film of the first conductivity type, thereby changing part of the polycrystalline semiconductor film of the first conductivity type except for the side portions thereof into a polycrystalline semiconductor layer of the second conductivity type, with the side portions of the polycrystalline semiconductor film of the first conductivity type left as polycrystalline semiconductor layers of the first conductivity type.

7. The method of claim 4, wherein the steps c) includes the steps of:

filling the trench with a polycrystalline semiconductor layer of the first conductivity type;

forming a small trench reaching the insulating layer, in a region in the polycrystalline semiconductor layer of the first conductivity type except for side portions thereof; and filling the small trench with a polycrystalline semiconductor layer of the second conductivity type using CVD including in-situ doping with an impurity of the first conductivity type.

8. The method of claim 4, wherein the steps c) includes the steps of:

depositing a polycrystalline semiconductor film of the first conductivity type to fill the trench therewith, and then etching back the polycrystalline semiconductor film of the first conductivity type, thereby forming polycrystalline semiconductor layers of the first conductivity type having the shape of sidewalls and covering respective sides of the side insulating films formed on the sides of the trench; and performing CVD including in-situ doping with an impurity of the second conductivity type, thereby forming a polycrystalline semiconductor layer of the second conductivity type filling a gap between the polycrystalline semiconductor layers of the first conductivity type.

9. The method of claim 4, wherein in the step a), an SOI substrate including a semiconductor layer made of single-crystalline silicon is used, and in the step c), a polycrystalline semiconductor layer of the first conductivity type and a polycrystalline semiconductor layer of the second conductivity type which are made of polycrystalline silicon are formed.

* * * * *